US008194488B2

(12) United States Patent
Han (10) Patent No.: US 8,194,488 B2
(45) Date of Patent: Jun. 5, 2012

(54) AUTO-REFRESH OPERATION CONTROL CIRCUIT FOR REDUCING CURRENT CONSUMPTION OF SEMICONDUCTOR MEMORY APPARATUS (75) Inventor: Hee Hyun Han, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 230 days.

(21) Appl. No.: 12/342,177

(22) Filed: Dec. 23, 2008

(65) Prior Publication Data

US 2009/0279373 A1   Nov. 12, 2009

(30) Foreign Application Priority Data

May 9, 2008   (KR) .................. 10-2008-0043617

(51) Int. Cl.
*G11C 7/00*   (2006.01)

(52) U.S. Cl. ... 365/222; 365/194; 365/203; 365/230.03; 365/230.06

(58) Field of Classification Search ............ 365/222, 365/194, 203, 189.05, 230.03, 230.06, 185.05
See application file for complete search history.

(56) References Cited

U.S. PATENT DOCUMENTS

| 6,292,420 | B1 * | 9/2001 | Kim et al. ............... 365/185.05 |
| 6,359,823 | B2 * | 3/2002 | Mullarkey ................... 365/222 |
| 6,538,956 | B2 * | 3/2003 | Ryu et al. .................. 365/233.1 |
| 7,042,774 | B2 * | 5/2006 | Kim ......................... 365/189.11 |
| 2007/0070766 | A1 * | 3/2007 | Kim ............................. 365/222 |
| 2007/0104005 | A1 | 5/2007 | Bowyer et al. |

FOREIGN PATENT DOCUMENTS

| JP | 2002-358778 A | 12/2002 |
| KR | 1020030052359 A | 6/2003 |
| KR | 1020030081979 A | 10/2003 |
| KR | 1020060075072 A | 7/2006 |
| KR | 1020080030361 A | 4/2008 |

* cited by examiner

*Primary Examiner* — Pho M Luu
*Assistant Examiner* — Thao Bui
(74) *Attorney, Agent, or Firm* — Ladas & Parry LLP (57) ABSTRACT

An auto-refresh operation control circuit for a semiconductor memory apparatus is activated according to a bank active signal for executing a refresh operation and terminates the refresh operation by receiving a precharge signal. The auto-refresh operation control circuit is configured to prevent an over-driving operation during an auto-refresh operation and to delay the enablement of the precharge signal. The auto-refresh operation control circuit also delays the enablement of the precharge signal during the auto-refresh operation more than a delay of the precharge signal during a self-refresh operation.

21 Claims, 9 Drawing Sheets

AUTO-REFRESH OPERATION CONTROL CIRCUIT FOR REDUCING CURRENT CONSUMPTION OF SEMICONDUCTOR MEMORY APPARATUS

CROSS-REFERENCES TO RELATED APPLICATION

The present application claims priority under 35 U.S.C. 119(a) to Korean application number 10-2008-0043617, filed on May 9, 2008, in the Korean Patent Office, which is incorporated by reference in its entirety as if set forth in full.

BACKGROUND OF THE INVENTION

1. Technical Field

The embodiments described herein relate generally to a semiconductor memory apparatus and, more particularly, to an auto-refresh operation control circuit in a semiconductor memory apparatus.

2. Related Art

Generally, an over-driving operation is carried out to improve a sensing speed when a semiconductor memory apparatus receives an active command. If the over-driving operation is carried out, a bit line or a bit bar line is fast sensed to a target voltage. However, current consumption increases as a result of over-driving operation.

Figure 1:
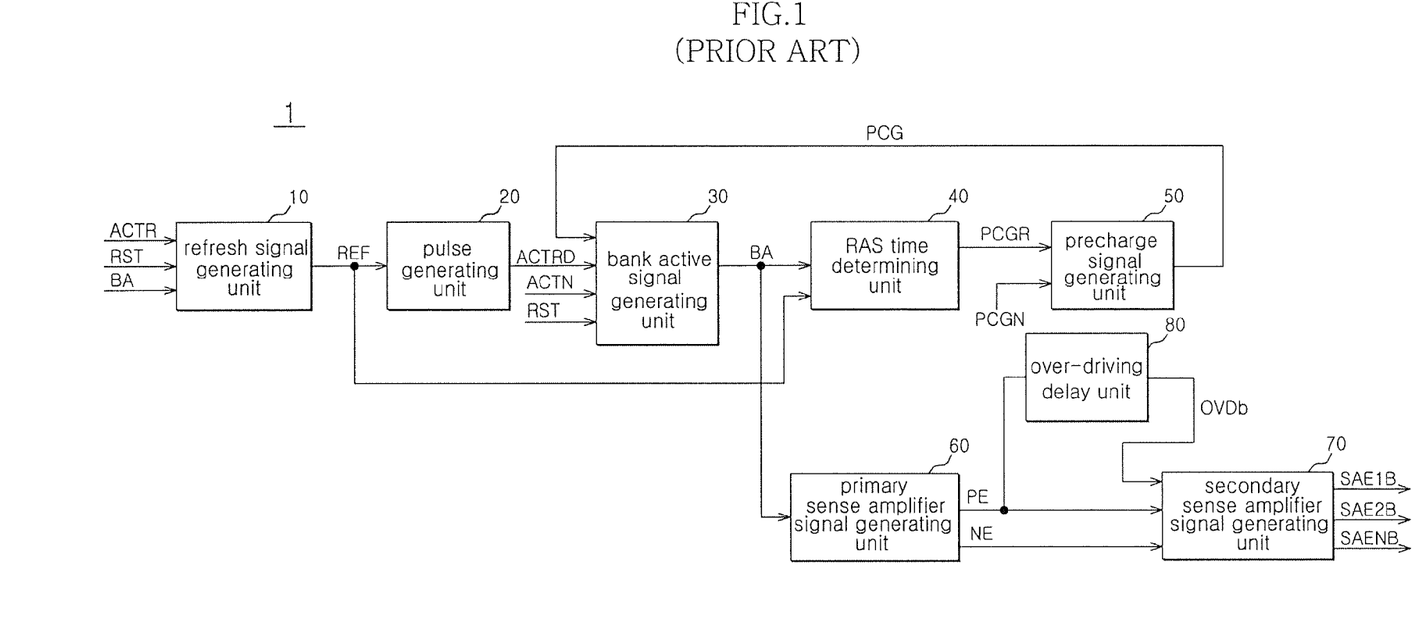
FIG. 1 is a schematic block diagram showing a conventional auto-refresh operation control circuit.

FIG. 1 is a schematic block diagram illustrating a conventional auto-refresh operation control circuit. The conventional auto-refresh control circuit includes a refresh signal generating unit 10 to receive a refresh operation signal 'ACTR' indicative of an refresh operation and then produce a refresh signal 'REF', a pulse generating unit 20 to produce a refresh operation pulse signal 'ACTRD', a bank active signal generating unit 30 to produce a bank active signal 'BA', a RAS (Row Address Strobe) time (tRAS) determining unit 40 to receive the bank active signal 'BA', a primary sense amplifier signal generating unit 60, a precharge signal generating unit 50 to receive an output signal 'PCGR' of the RAS time determining unit 40 and then produce a precharge signal 'PCG', an over-driving delay unit 80 to receive output signal 'PE' of the primary sense amplifier signal generating unit 60 and then produce a delay signal 'OVDb', and a secondary sense amplifier signal generating unit 70.

Figure 2:
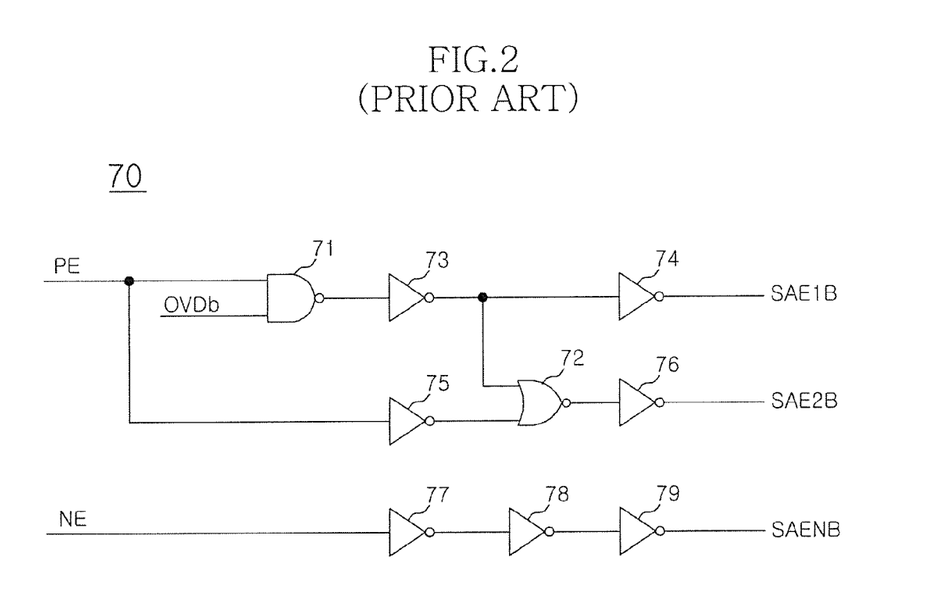
FIG. 2 is a circuit diagram showing a secondary sense amplifier signal generating unit in FIG. 1.

FIG. 2 is a circuit diagram showing the secondary sense amplifier signal generating unit 70 of FIG. 1. The secondary sense amplifier signal generating unit 70 includes a NAND gate 71 to receive a PMOS enable signal 'PE' from the primary sense amplifier signal generating unit 60 and the delay signal 'OVDb' from the over-driving delay unit 80, a first inverter 73 to invert an output signal of the NAND gate 71, a second inverter 74 to receive an output signal of the first inverter 73 and then output an over-driving operation signal 'SAE1B', a third inverter 75 to receive the PMOS enable signal 'PE', a NOR gate 72 to receive output signals of the first and third inverters 73 and 75, a fourth inverter 76 to receive an output signal of the NOR gate 72 and produce a sense amplifier latch PMOS enable signal 'SAE2B' for sensing an internal core voltage VCORE, and fifth to seventh inverters 77 to 79 serially coupled to each other to receive the NMOS enable signal 'NE' from the primary sense amplifier signal generating unit 60 and then produce a sense amplifier latch NMOS enable signal 'SAENB'.

Figure 3:
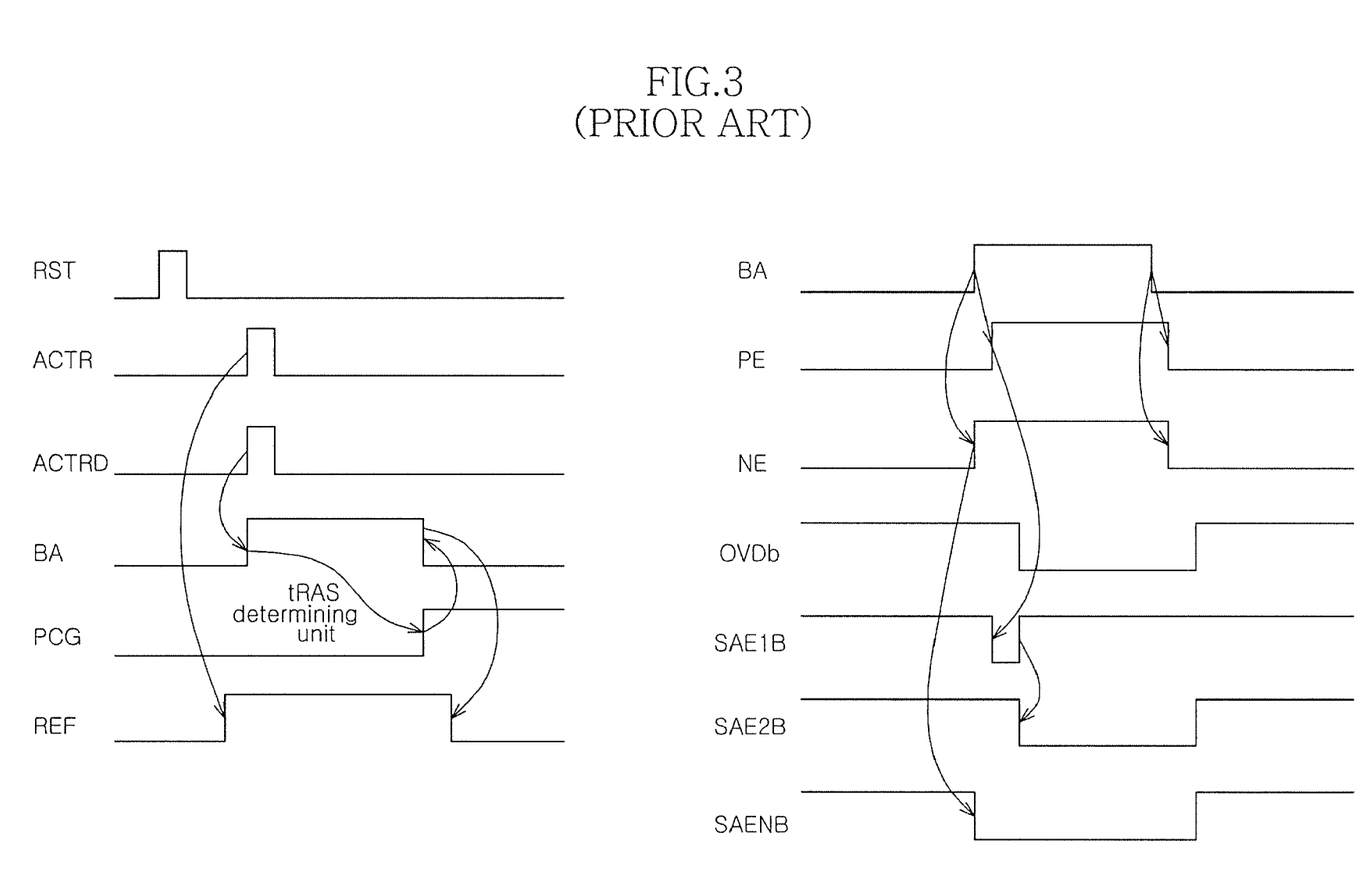
FIG. 3 is a timing chart illustrating the operation of the conventional auto-refresh operation control circuit.

FIG. 3 is a timing chart showing an operation of the conventional auto-refresh operation control circuit. Referring to FIG. 3, if a refresh command is input from an external circuit, a command decoder generates the refresh operation signal 'ACTR' indicative of the refresh operation. The refresh operation signal 'ACTR' is then input into the refresh signal generating unit 10 to produce the refresh signal 'REF'. The pulse signal 'ACTRD' is generated by the pulse generating unit 20, which receives the refresh signal 'REF'. The bank active signal generating unit 30, which receives the pulse signal 'ACTRD', generates the bank active signal 'BA' having a high level. The RAS time determining unit 40 delays the bank active signal 'BA' and then produces the refresh precharge signal 'PCGR' which is input into the precharge signal generating unit 50. The precharge signal generating unit 50 produces the precharge signal 'PCG'. The precharge signal 'PCG' is input to the bank active signal generating unit 30 to disable the bank active signal 'BA'. The bank active signal 'BA' is also input into the primary sense amplifier signal generating unit 60 so that the PMOS enable signal 'PE' and the NMOS enable signal 'NE' are enabled. The secondary sense amplifier signal generating unit 70, to which the PMOS enable signal 'PE' and the NMOS enable signal 'NE' are applied, produces the over-driving operation signal 'SAE1B' for performing the over-driving operation.

Accordingly, the high-speed sensing that operates according to the over-driving operation is not needed since the read command is not input during the refresh cycle time (tREC) in the auto-refresh operation mode. However, in the conventional semiconductor memory apparatus, there is a disadvantage in that a large amount of current consumption is caused due to the over-driving operation.

SUMMARY

An auto-refresh operation control circuit in a semiconductor memory apparatus capable of reducing current consumption by stopping an over-driving operation in an auto-refresh operation mode is described herein.

According to one embodiment of the present invention, an auto-refresh operation control circuit of a semiconductor memory apparatus is activated by a bank active signal for executing a refresh operation and terminates the refresh operation by receiving a precharge signal, and configured to prevent an over-driving operation at an auto-refresh operation and to delay an enablement of the precharge signal, wherein the enablement of the precharge signal at the auto-refresh operation is delayed more than that of the precharge signal at a self-refresh operation.

According to another embodiment of the present invention, an auto-refresh operation control circuit is configured to determine an enablement of an over-driving signal in response to a refresh mode signal and to determine an operation time of a precharge in response to the refresh mode signal.

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DETAILED DESCRIPTION

Figure 4:
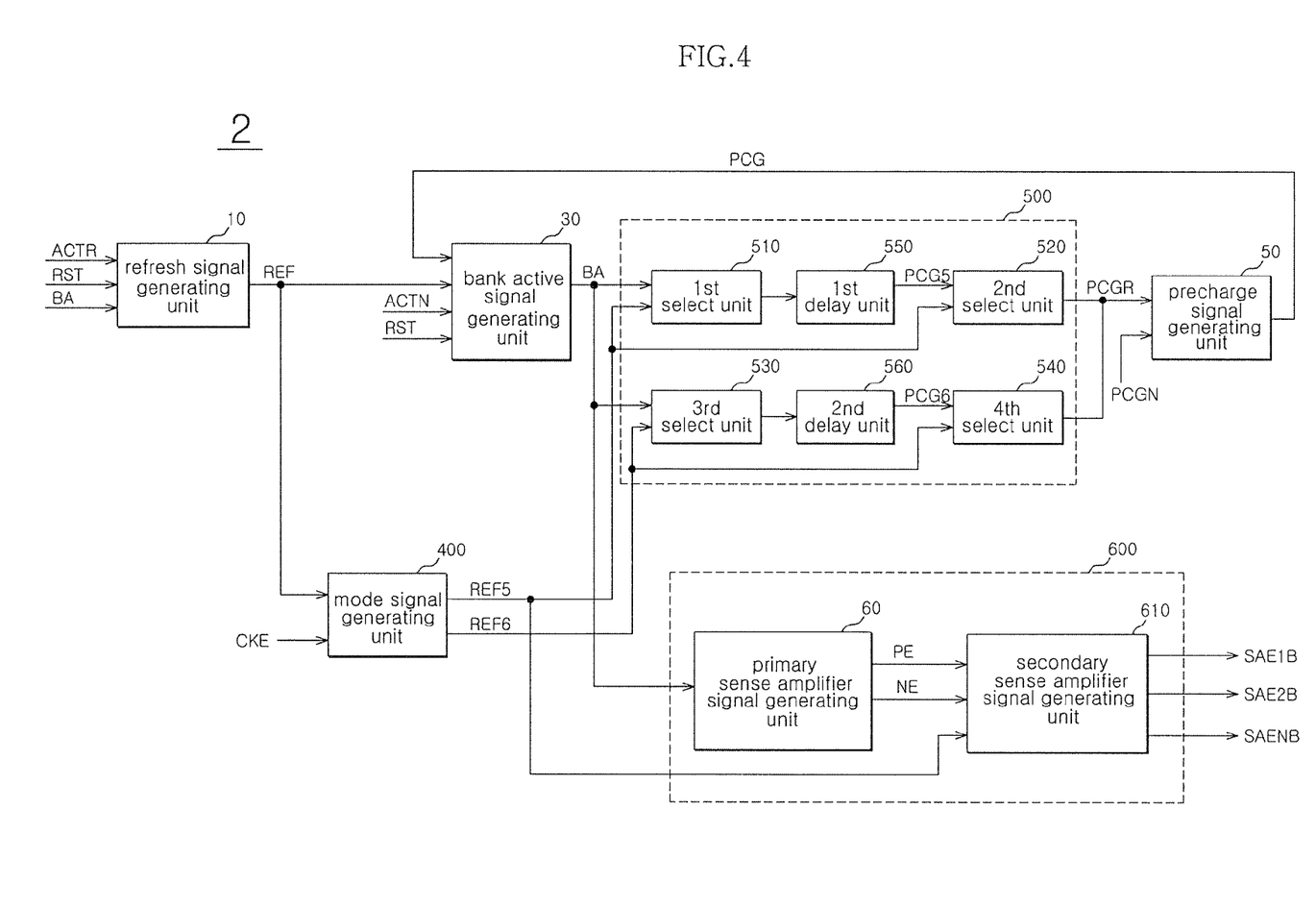
FIG. 4 is a schematic block diagram showing an exemplary auto-refresh operation control circuit according to one embodiment of the present invention.

FIG. 4 is a schematic block diagram showing an exemplary auto-refresh operation control circuit according to one embodiment of the present invention. The auto-refresh operation control circuit 2 according to one embodiment of the present invention can be employed in a semiconductor memory apparatus that starts a refresh operation according to a bank active signal 'BA' and terminates the refresh operation according to an input of a precharge signal 'PCG'. The auto-refresh operation control circuit 2 of the semiconductor memory apparatus according to one embodiment of the present invention is configured to stop an over-driving operation according to an auto-refresh operation and to delay an enable time of the precharge signal 'PCG'. That is, in one embodiment of the present invention, the enable time of the precharge signal 'PCG' is delayed more at the auto-refresh operation than at a self-refresh operation.

As shown in FIG. 4, the auto-refresh operation control circuit 2 according to one embodiment of the present invention can include a bank active signal generating unit 30, a mode signal generating unit 400, a delay time determining unit 500, a precharge signal generating unit 50, and a sense amplifier signal generating unit 600. The bank active signal generating unit 30 receives a refresh signal 'REF' and then enables the bank active signal 'BA'. Additionally, the bank active signal generating unit 30 receives the precharge signal 'PCG' from the precharge signal generating unit 50 and disables the bank active signal 'BA' correspondingly. The mode signal generating unit 400 receives the refresh signal 'REF' and a clock enable signal 'CKE'. The clock enable signal 'CKE' is a signal that is at a high level during an auto-refresh operation mode and at a low level during a self-refresh operation mode. The mode signal generating unit 400 produces an auto-refresh mode signal 'REF5' and a self-refresh mode signal 'REF6' that are divided according to the refresh operation mode. That is, when in the auto-refresh operation mode, the auto-refresh mode signal 'REF5' is enabled and the self-refresh mode signal 'REF6' is disabled. In contrast, when in the self-refresh operation mode, the auto-refresh mode signal 'REF5' is disabled and the self-refresh mode signal 'REF6' is enabled.

The RAS time is calculated from an activation of a sense amplifier to the stabilization thereof in the semiconductor memory apparatus. The delay time determining unit 500 receives the bank active signal 'BA' and a mode signal according to the refresh operation mode, and then produces a refresh precharge signal 'PCGR' when in the auto-refresh operation mode by performing a delay operation to ensure the RAS time is sufficient. During the auto-refresh operation mode, the RAS time is increased to allow cell data to be stored sufficiently, rather than utilizing the over-driving operation.

In order to increase the RAS time during the auto-refresh operation mode, the delay time determining unit 500 includes a first select unit 510 to receive the auto-refresh mode signal 'REF5' and the bank active signal 'BA', a first delay unit 550 to receive an output signal of the first select unit 510, a second select unit 520 to receive an output signal of the first delay unit 550 and the auto-refresh mode signal 'REF5', a third select unit 530 to receive the self-refresh mode signal 'REF6' and the bank active signal 'BA', a second delay unit 560 to receive an output signal of the third select unit 530, and a fourth select unit 540 to receive to receive an output signal of the second delay unit 560 and the self-refresh mode signal 'REF6'. The first select unit 510 and the third select unit 530 have the same configuration and the second select unit 520 and the fourth select unit 540 also have the same configuration.

When in the auto-refresh operation mode, the auto-refresh mode signal 'REF5' is enabled and the self-refresh mode signal 'REF6' is disabled. The first select unit 510 outputs a signal, which is enabled only when both the bank active signal 'BA' and the auto-refresh mode signal 'REF5' are enabled. The output signal of the first select unit 510 is delayed through the first delay unit 550 to sufficiently increase the RAS time. The second select unit 520 receives the delayed signal from the first delay unit 550 and outputs it as the refresh precharge signal 'PCGR' to the precharge signal generating unit 50. The third select unit 530 receives the enabled bank active signal 'BA', but outputs a disabled signal because the self-refresh mode signal 'REF6' is disabled.

Meanwhile, when in the self-refresh operation mode, the self-refresh mode signal 'REF6' is enabled and the auto-refresh mode signal 'REF5' is disabled. Accordingly, the first select unit 510 outputs a disabled signal and the third select unit 530 outputs an enabled signal. The second delay unit 560 receives the enable signal from the third select unit 530 and performs the delay operation. The delay time of the second delay unit 560 is shorter than that of the first delay unit 550 so that the relatively sufficient RAS time can be guaranteed when in the auto-refresh operation mode.

The delayed signal is produced as the refresh precharge signal 'PCGR' through the fourth select unit 540. The refresh precharge signal 'PCGR' is then input to the precharge signal generating unit 50. The precharge signal generating unit 50 receives the refresh precharge signal 'PCGR', which is the output signal of the second select unit 520 or the fourth select unit 540 of the delay time determining unit 500, and produces the precharge signal 'PCG'. The precharge signal 'PCG' is input to the bank active signal generating unit 30 and disables the bank active signal 'BA'.

The sense amplifier signal generating unit 600 receives the back active signal 'BA' and the auto-refresh mode signal 'REF5' and produces an over-driving operation signal 'SAE1B' that is disabled when the auto-refresh mode signal 'REF5' is enabled. The sense amplifier signal generating unit 600 can include a primary sense amplifier signal generating unit 60 to receive the bank active signal 'BA' and produce a PMOS enable signal 'PE' and an NMOS enable signal 'NE'. The sense amplifier signal generating unit 600 can also include a secondary sense amplifier signal generating unit 610 to receive the PMOS enable signal 'PE' and the NMOS enable signal 'NE' and produce a plurality of sense amplifier signals 'SAE1B', 'SAE2B' and 'SAENB'. The secondary sense amplifier signal generating unit 610 disables the overdriving operation signal 'SAE1B' when the auto-refresh mode signal 'REF5' is enabled.

The auto-refresh operation control circuit 2 according to one embodiment can further include a refresh signal generating unit 10 to produce a refresh signal 'REF'. The refresh signal generating unit 10, receives the refresh operation signal 'ACTR' and the bank active signal 'BA' and produces the refresh signal 'REF'. The refresh signal 'REF' is enabled when the refresh operation signal 'ACTR' is enabled. The refresh signal 'REF' is disabled when the bank active signal 'BA' is disabled. In addition, a reset signal 'RST' can be further input to the refresh signal generating unit 10. The reset signal 'RST' is a high-level pulse signal to disable the refresh signal 'REF' at an initial state.

Figure 5:
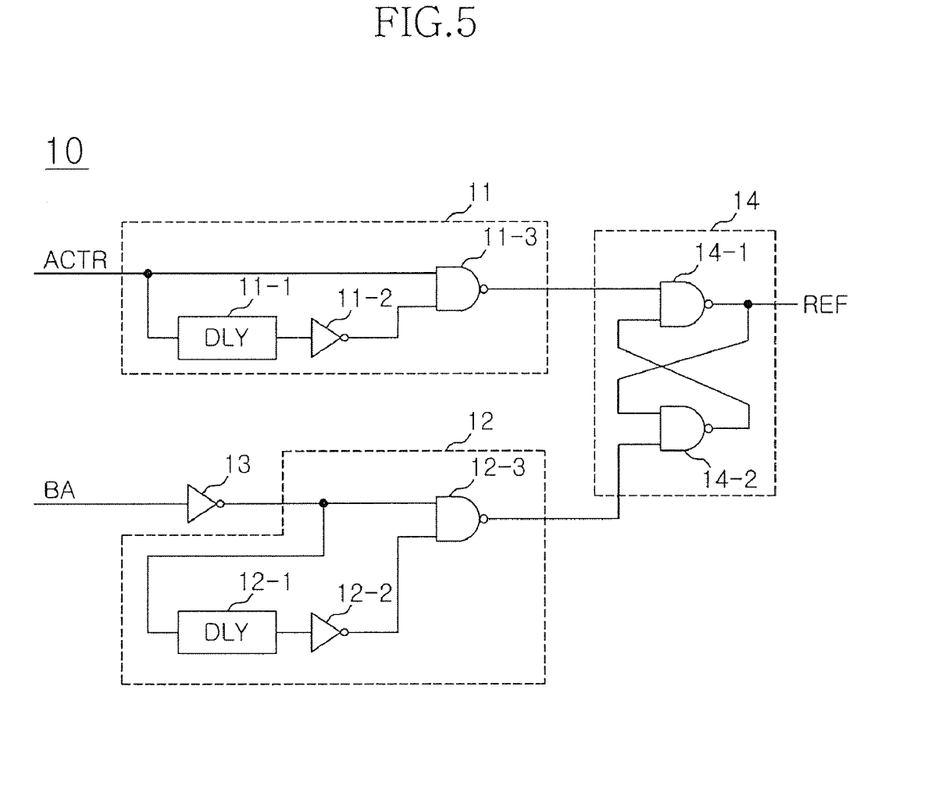
FIG. 5 is a circuit diagram showing an example of a refresh signal generating unit of FIG. 4.

The detailed configuration of the auto-refresh operation control circuit 2 of the semiconductor memory apparatus according to one embodiment of the present invention will be described below. FIG. 5 is a circuit diagram of the refresh signal generating unit 10. The refresh signal generating unit 10 can include a first pulse generating unit 11 to receive the refresh operation signal 'ACTR', an inverter 13 to invert the bank active signal 'BA', a second pulse generating unit 12 to receive an output signal of the inverter 13, and a RS flip-flop 14 having a set terminal to receive an output signal of the first pulse generating unit 11 and a reset terminal to receive an output signal of the second pulse generating unit 12. The first pulse generating unit 11 can include a delay unit 11-1 to delay the refresh operation signal 'ACTR' for a predetermined time, an inverter 11-2 to invert an output signal of the delay unit 11-1, and a NAND gate 11-3 to receive the refresh operation signal 'ACTR' and an output signal of the inverter 11-2. Similar to the first pulse generating unit 11, the second pulse generating unit 12 can include a delay unit 12-1, an inverter 12-2, and a NAND gate 12-3. The RS flip-flop 14 can include first and second NAND gates 14-1 and 14-2 of which the first input terminals of each NAND gates 14-1 and 14-2 receive the output signals of the first and second pulse generating units 11 and 12, respectively, and of which the second input terminals of each NAND gates 14-1 and 14-2 are coupled to output terminals thereof, respectively, to form an RS flip-flop.

When the refresh operation signal 'ACTR' has a high level and is input to the refresh signal generating unit 10, a high level pulse is input to the set terminal of the RS flip-flop 14 through the first pulse generating unit 11 so that the refresh signal 'REF' is produced having a high level. When the bank active signal 'BA' is disabled by the precharge signal 'PCG', a high level pulse is input to the reset terminal of the RS flip-flop 14 through the inverter 13 and the second pulse generating unit 12 so that the refresh signal 'REF' is disabled.

Figure 6:
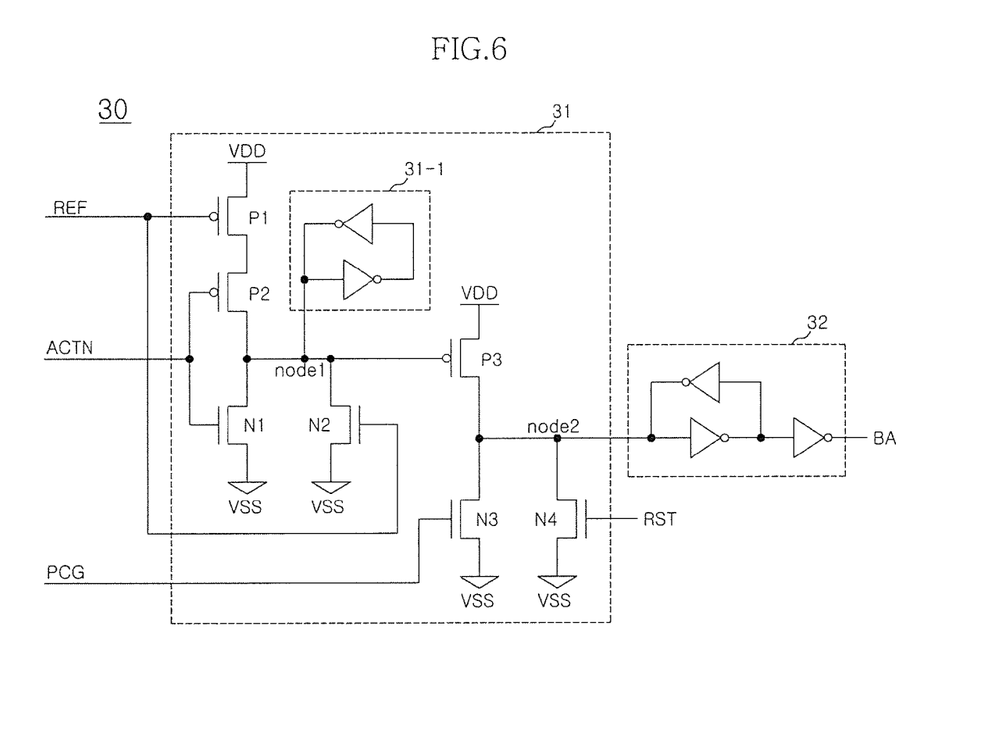
FIG. 6 is a circuit diagram showing an example of a bank active signal generating unit of FIG. 4.

FIG. 6 is a circuit diagram of the bank active signal generating unit 30. The bank active signal generating unit 30 can include an activation signal generating unit 31 and a first latch unit 32. The activation signal generating unit 31 outputs a signal to determine activation of the bank active signal 'BA' according to the received refresh signal 'REF', normal active signal 'ACTN', precharge signal 'PCG', and reset signal 'RST'. An output signal of the activation signal generating unit 31 through the first latch 32 can serve as the bank active signal 'BA'. The activation signal generating unit 31 can include a first PMOS transistor P1 having a gate connected to the refresh signal 'REF' and a source connected to an external power supply voltage VDD and a second PMOS transistor P2 having a gate connected to the normal active signal 'ACTN', a source connected to a drain of the first PMOS transistor P1, and a drain connected to a common node 'node1'. The activation signal generating unit 31 can also include a first NMOS transistor N1 having a gate connected to the normal active signal 'ACTN', a source connected to a ground voltage VSS, and a drain connected to the common node 'node1' and a second NMOS transistor N2 having a gate connected to the refresh signal 'REF', a source connected to the ground voltage VSS, and a drain connected to the common node 'node1'. The activation signal generating unit 31 additionally can include a second latch unit 31-1 coupled to the common node 'node1', a third PMOS transistor P3 having a gate connected to the common node 'node1', a source connected to the external power supply voltage VDD, and a drain connected to a common node 'node2'. A third NMOS transistor N3 has a gate connected to the precharge signal 'PCG', a source connected to the ground voltage VSS, and a drain connected to the common node 'node2', and a fourth NMOS transistor N4 has a gate connected to the reset signal 'RST', a source connected to the ground voltage VSS, and a drain connected to the common node 'node2'.

When the refresh signal 'REF' is enabled and at a high level, the first PMOS transistor P1 is turned off and the second NMOS transistor N2 is turned on. Accordingly, the ground voltage is applied to the gate of the third PMOS transistor P3 and the third PMOS transistor P3 is turned on so that the external power supply voltage VDD is applied to the common node 'node2'. As a result, the bank active signal 'BA' is enabled through the first latch unit 32.

Where there is a normal active command (active commands other than the active command for the refresh operation), more specifically, in the case where the normal active signal 'ACTN' is enabled to a high level, the second PMOS transistor P2 is turned off and the first NMOS transistor N1 is turned on so that the ground voltage VSS is applied to the gate of the third PMOS transistor P3 and the third PMOS transistor P3 is turned on. Therefore, the bank active signal 'BA' is enabled having a high level. In contrast the third NMOS transistor N3 is turned on and the ground voltage VSS is applied to the common node 'node2' so that the bank active signal 'BA' is disabled when the precharge signal 'PCG' is enabled at a high level. In the case where the reset signal 'RST' having a high level pulse is applied to disable the bank active signal 'BA' at initialization, the bank active signal 'BA' is disabled by turning on the fourth NMOS transistor N4 and thereby applying the ground voltage VSS to the common node 'node2'.

Figure 7:
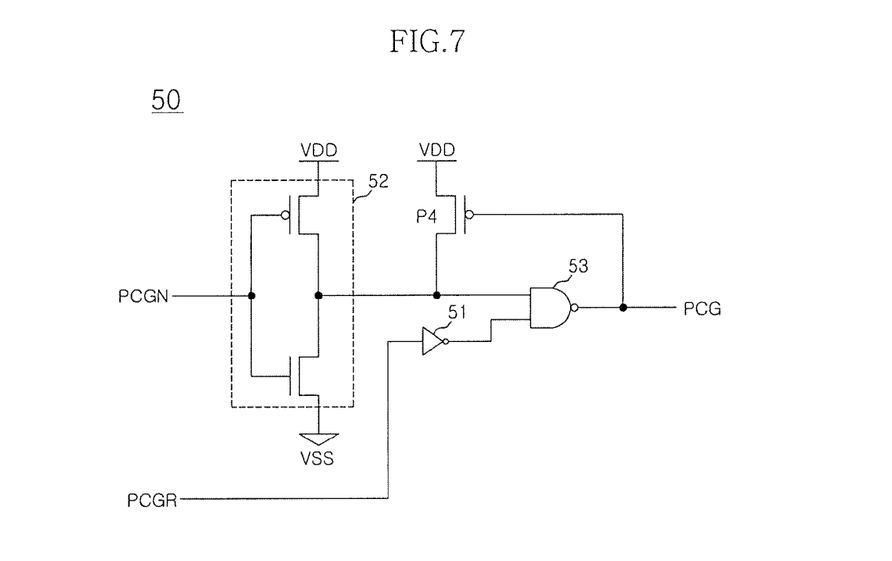
FIG. 7 is a circuit diagram showing an example of a precharge signal generating unit of FIG. 4.

FIG. 7 is a circuit diagram of the precharge signal generating unit 50.

The precharge signal generating unit 50 can include a first inverter 51 to invert the refresh precharge signal 'PCGR', a second inverter 52 to invert a normal precharge signal 'PCGN', a NAND gate 53 to receive an output signal of the first inverter 51 and an output signal of the second inverter 52, and a PMOS transistor P4 having a gate connected to an output terminal of the NAND gate 53, a source connected the external power supply voltage VDD, and a drain connected to an output terminal of the second inverter 52.

When the refresh precharge signal 'PCGR' is enabled and at a high level, the precharge signal 'PCG' is produced and enabled having a high level via the first inverter 51 and the NAND gate 53. Where there is a normal precharge command (precharge commands other than the precharge command for the refresh operation), the precharge signal 'PCG' is also produced and enabled having a high level via the first inverter 51 and the NAND gate 53 when the refresh precharge signal 'PCGR' is enabled. The PMOS transistor P4 functions as a latch circuit in the precharge signal generating unit 50.

The primary sense amplifier signal generating unit 60 can be configured using a conventional sense amplifier signal generator and as such, a detailed illustration will be omitted.

Figure 8:
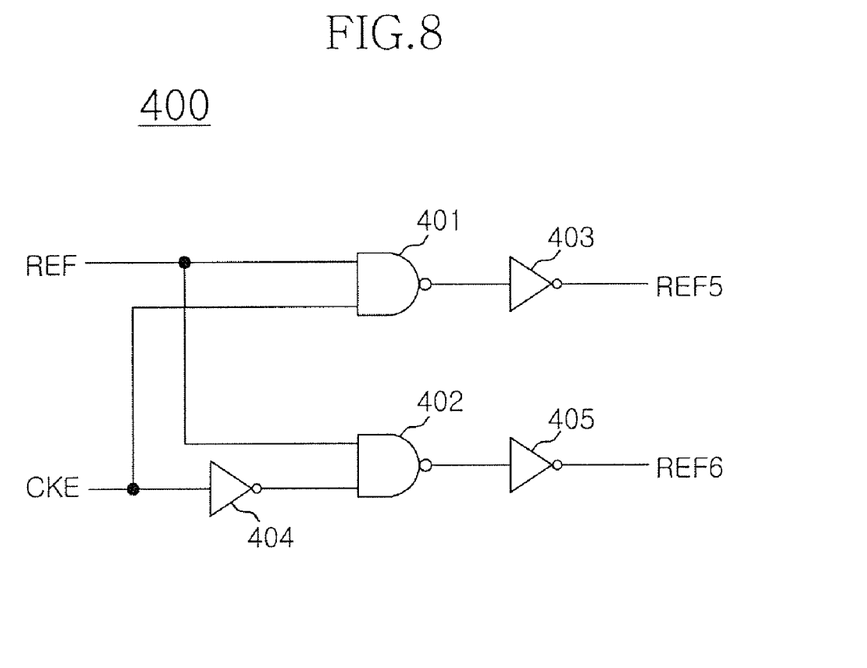
FIG. 8 is a circuit diagram showing an example of a mode signal generating unit in FIG. 4.

FIG. 8 is a detailed circuit diagram showing an example of the mode signal generating unit 400.

As shown in FIG. 8, the mode signal generating unit 400 can include a first NAND gate 401 to receive the refresh signal 'REF' and the clock enable signal 'CKE', a first inverter 403 outputting the auto-refresh mode signal 'REF5', which is a mode signal for the auto-refresh operation, by inverting an output signal of the first NAND gate 401, a second inverter 404 to invert the clock enable signal 'CKE', a second NAND gate 402 to receive the refresh signal 'REF' and an output signal of the second inverter 404, and a third inverter 405 to output the self-refresh mode signal 'REF6', which is a mode signal for the self-refresh operation, by inverting an output signal of the second NAND gate 402.

The mode signal generating unit 400 receives the refresh signal 'REF' and the clock enable signal 'CKE'. The clock enable signal 'CKE' has a high level signal during the auto-refresh operation mode and has a low level signal during the self-refresh operation mode. The mode signal generating unit 400, which receives the refresh signal 'REF' and the clock enable signal 'CKE', produces the auto-refresh mode signal 'REF5' and the self-refresh mode signal 'REF6' that are divided signals according to the refresh operation mode. The refresh signal 'REF' is enabled having a high level and the clock enable signal 'CKE' also has a high level during the auto-refresh operation mode. Accordingly, the first NAND gate 401, which receive the refresh signal 'REF' and the clock enable signal 'CKE', outputs a low level signal. The low level output signal of the first NAND gate 401 is inverted by the first inverter 403, thereby producing the auto-refresh mode signal 'REF5' that is enabled having a high level. Furthermore, the second NAND gate 402, which receives the inverted clock enable signal 'CKE' and the refresh signal 'REF', outputs a high level signal. The high level output signal of the second NAND gate 402 is inverted by the third inverter 405, thereby producing the self-refresh mode signal 'REF6' that is disabled having a low level.

During the self-refresh operation mode, the clock enable signal 'CKE' has a low level, the auto-refresh mode signal 'REF5' is disabled having a low level, and the self-refresh mode signal 'REF6' is enabled having a high level. Where the refresh signal 'REF' has a low level, both the auto-refresh mode signal 'REF5' and the self-refresh mode signal 'REF6' are disabled having a low level.

Figure 9:
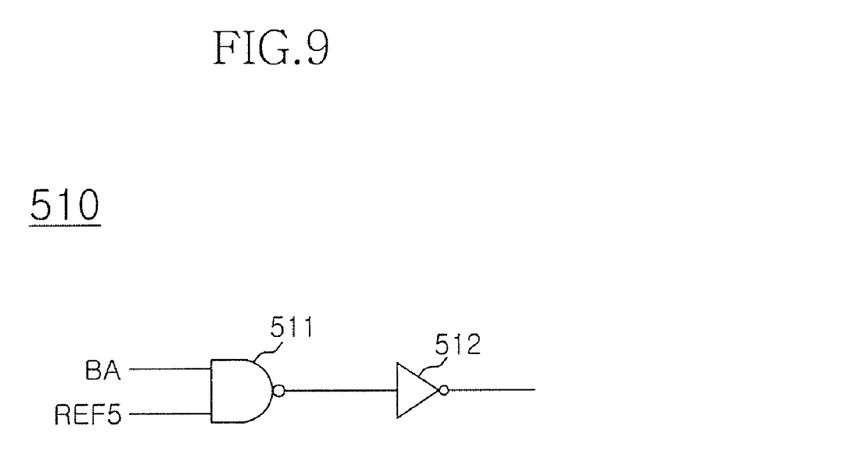
FIG. 9 is a circuit diagram showing an example of a first select unit in FIG. 4.

FIG. 9 is a circuit diagram showing an example of the first select unit 510 of the delay time determining unit 500 according to one embodiment of the present invention. As shown in FIG. 9, the first select unit 510 can include a NAND gate 511 to receive the bank active signal 'BA' and the auto-refresh mode signal 'REF5', and an inverter 512 to invert an output signal of the NAND gate 511. The third select unit 530 has the same configuration as the first select unit 510, but receives the bank active signal 'BA' and the self-refresh mode signal 'REF6' instead. Accordingly, the first and third select units 510 and 530 output enable signals when the bank active signal 'BA' and the mode signal (the auto-refresh mode signal 'REF5' or the self-refresh mode signal 'REF6') are enabled. The output enable signals of the first and third select units 510 and 530 are input to the first and second delay units 550 and 560, respectively.

Figure 10:
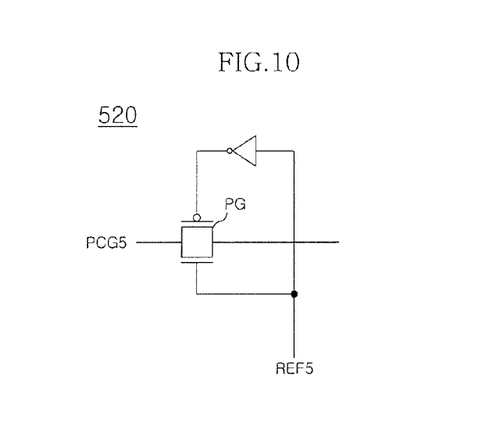
FIG. 10 is a circuit diagram showing an example of a second select unit in FIG. 4.

FIG. 10 is a circuit diagram showing an example of the second select unit 520 of the delay time determining unit 500 according to one embodiment of the present invention. As shown in FIG. 10, the second select unit 520 can include a pass gate PG to receive the auto-refresh mode signal 'REF5' and an output signal 'PCG5' of the first delay unit 550. The pass gate PG passes the output signal 'PCG5' of the first delay unit 550 according to both the auto-refresh mode signal 'REF5' and an inverted signal of the auto-refresh mode signal 'REF5'. The fourth select unit 540 has the same configuration as the second select unit 520, but receives an output signal 'PCG6' of the second delay unit 560 and the self-refresh mode signal 'REF6' instead.

The signals that are input to the bank active signal generating unit 30 include the refresh signal 'REF', a feedback signal of the precharge signal 'PCG', the active normal signal 'ACTN' which is enabled having a high level when the normal active command is received, and a reset signal 'RST' that has a high level pulse signal to initialize the bank active signal generating unit 30. The bank active signal generating unit 30 receives these signals enables the bank active signal 'BA' accordingly. Furthermore, the bank active signal 'BA', the auto-refresh mode signal 'REF5', and the self-refresh mode signal 'REF6', which are generated by the mode signal generating unit 400, are input to the first and second select units 510 and 530 in the delay time determining unit 500 respectively.

As mentioned above, the delay time determining unit 500 can include the first to fourth select units 510 to 540 and the first and second delay units 550 and 560. The bank active signal 'BA' and the auto-refresh mode signal 'REF5' are input to the first select unit 510 and the bank active signal 'BA' and the self-refresh mode signal 'REF6' are input to the third select unit 530. The first delay unit 550 receives the output signal of the first select unit 510 and the second delay unit 560 receives the output signal of the second select unit 530.

Where the bank active signal 'BA' is enabled having a high level and the operation mode is the auto-refresh operation mode, the auto-refresh mode signal 'REF5' is enabled having a high level and is input to the first select unit 510 so that the first select unit 510 outputs an enabled signal having a high level. The high level enable signal is then delayed by the first delay unit 550.

The delayed signal 'PCG5' is input to the second select unit 520 and the delayed signal 'PCG5' passes through the pass gate PG of the second select unit 520. Meanwhile, the third select unit 530, receives the disabled self-refresh mode signal 'REF6' and outputs a low level signal. The low level signal passes through the second delay unit 560. However, the low level signal 'PCG6' passed from the second delay unit 560 to the fourth select unit 540 is not passed via the fourth select unit 540 because the pass gate is not activated due to the application of the disabled self-refresh mode signal 'REF6' to the pass gate. Accordingly, the refresh precharge signal 'PCGR' is delayed and enabled having a high level in response to the auto-refresh mode signal 'REF5' having a high level in the second select unit 520. The refresh precharge signal 'PCGR' is then input to the precharge signal generating unit 50.

Where the bank active signal 'BA' is enabled having a high level and the operation mode is the self-refresh operation mode, the auto-refresh mode signal 'REF5' is disabled and the self-refresh mode signal 'REF6' is enabled having a high level. The first select unit 510 receives the bank active signal 'BA' and the auto-refresh mode signal 'REF5' and outputs a low level signal. The outputted low level signal passes through the first delay unit 550, but does not pass through the pass gate PG of the second select unit 520. The third select unit 530 receives the bank active signal 'BA' and the self-refresh mode signal 'REF6' and outputs a signal that is enabled having a high level. The outputted high level signal passes through the second delay unit 560 and the fourth select unit 540 produces the refresh precharge signal 'PCGR'. The refresh precharge signal 'PCGR' is then input to the precharge signal generating unit 50.

The first and second delay units 550 and 560, which determine the RAS time, are different from each other in the amount of delay time they apply to the RAS time. The first delay unit 550, which pertains to the auto-refresh operation mode, executes the delay operation to sufficiently delay the signal according to one embodiment of the present invention. That is, the first delay unit 550 delays the signal to provide a sufficient amount of RAS time so that the cell data can be adequately stored. In contrast, the second delay unit 560, which pertains to the self-refresh operation mode, executes the delay operation so as to delay the signal less than the first delay unit 550. That is, in one embodiment of the present invention, the RAS time can be determined by discriminating between the auto-refresh operation mode and the self-refresh operation mode.

Figure 11:
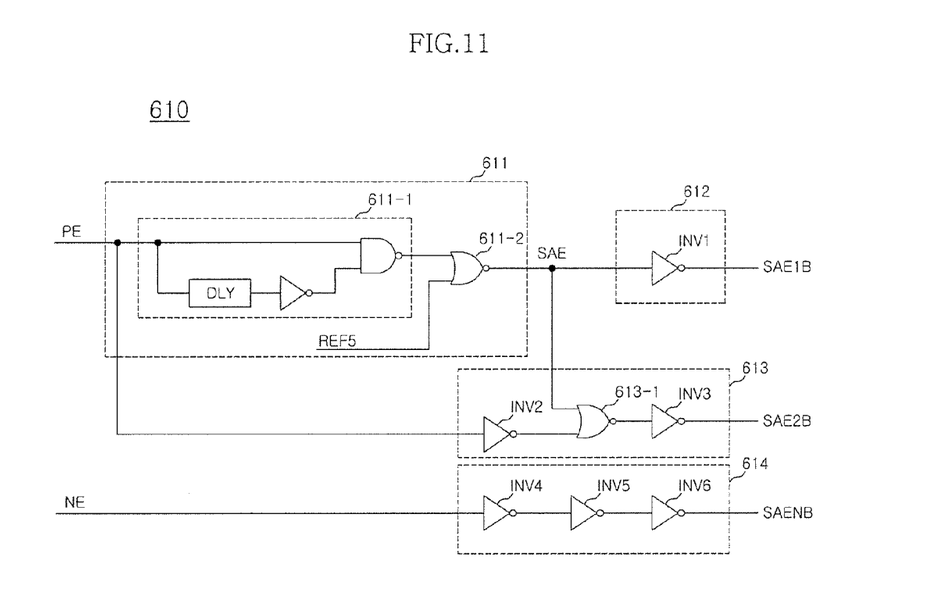
FIG. 11 is a circuit diagram showing a secondary sense amplifier signal generating unit according to one embodiment of the present invention.

FIG. 11 is a detailed circuit diagram showing the secondary sense amplifier signal generating unit 610 according to one embodiment of the present invention.

The secondary sense amplifier signal generating unit 610 in the sense amplifier signal generating unit 600 can include a signal combining unit 611 to receive the PMOS enable signal 'PE' and produce a combination signal 'SAE' in response, an over-driving operation signal generating unit 612 to receive the combination signal 'SAE' and produce the over-driving operation signal 'SAE1B' in response, a first sense amplifier signal generating unit 613 to receive the PMOS enable signal 'PE' and the combination signal 'SAE' and produce the first sense amplifier signal 'SAE2B' in response, and a second sense amplifier signal generating unit 614 to receive the NMOS enable signal 'NE' and produce the second sense amplifier signal 'SAENB' in response.

The signal combining unit 611 can include a pulse generating unit 611-1 to receive the PMOS enable signal 'PE' and a NOR gate 611-2 to receive the auto-refresh mode signal 'REF5' and an output signal of the pulse generating unit 611-1.

The over-driving operation signal generating unit 612 can include a first inverter INV1 to invert the combination signal 'SAE' from the signal combining unit 611 and produce the over-driving operation signal 'SAE1B'.

The first sense amplifier signal generating unit 613 can include a second inverter INV2 to invert the PMOS enable signal 'PE', a NOR gate 613-1 to receive the combination signal 'SAE' and an output signal of the second inverter INV2, and a third inverter to produce the first sense amplifier signal 'SAE2B' by inverting an output signal of the NOR gate 613-1.

The second sense amplifier signal generating unit 614 can include serially connected fourth thru sixth inverters INV4, INV5, and INV6 that produce the second sense amplifier signal 'SAENB' by sequentially inverting the NMOS enable signal 'NE'.

In the secondary sense amplifier signal generating unit 610, the combination signal 'SAE' is disabled having a low level and the first inverter INV1 of the over-driving operation signal generating unit 612 inverts the combination signal 'SAE' to create a high level signal when the auto-refresh mode signal 'REF5' is enabled via the NOR gate 611-2 of the signal combining unit 611. Accordingly, the over-driving signal 'SAE1B' is fixed to have a high level signal and as a result, the over-driving operation is not carried out.

Figure 12:
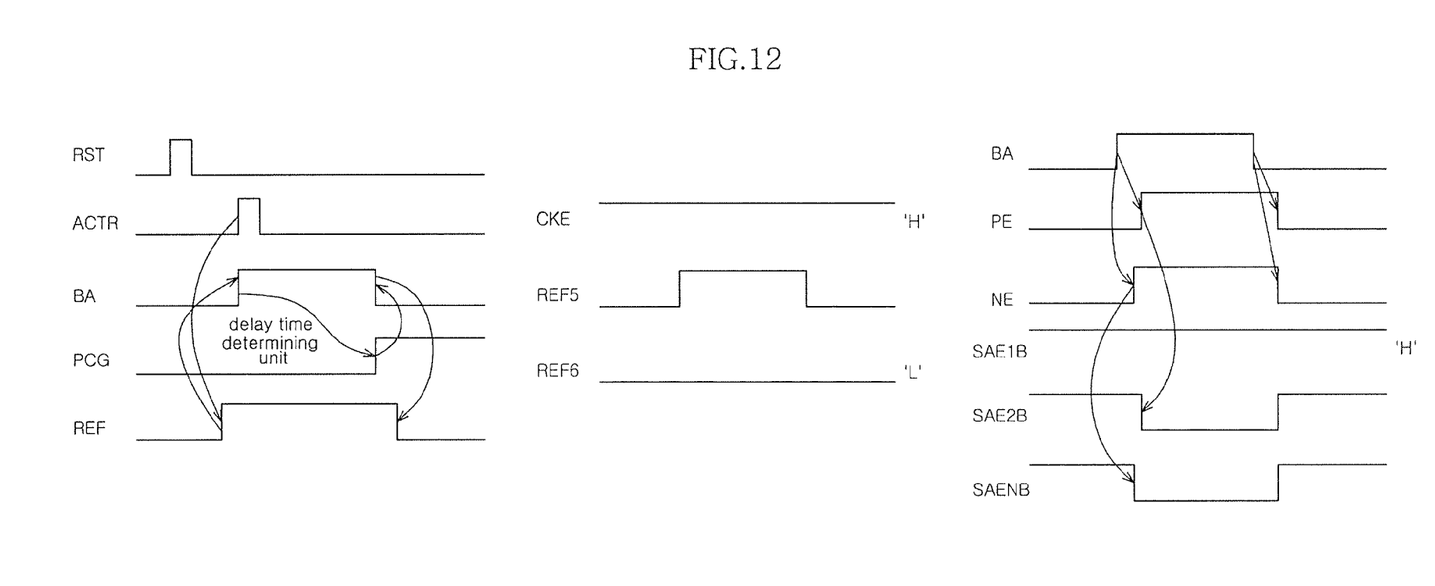
FIG. 12 is a timing chart illustrating the operation of the auto-refresh operation control circuit according to one embodiment of the present invention.

The operation of the auto-refresh operation control circuit 2 according to one embodiment of the present invention will now be described in detail with reference to FIG. 12. When the refresh operation is carried out, the refresh operation signal 'ACTR' that indicates the refresh operation is input to the refresh signal generating unit 10 and the refresh signal generating unit 10 enables the refresh signal 'REF' correspondingly. The refresh signal 'REF' is input to the bank active signal generating unit 30 and then the bank active signal generating unit 30 enables the bank active signal 'BA'. The refresh signal 'REF' is input to the mode signal generating unit 400 and the mode signal generating unit 400 enables the auto-refresh mode signal 'REF5' during the auto-refresh operation mode and enables the self-refresh mode signal 'REF6' during the self-refresh operation mode. An output signal is enabled having a high level by the first select unit 510 that receives the bank active signal 'BA' and the auto-refresh mode signal 'REF5'. The output signal of the first select unit 510 is then delayed by the first delay unit 550. The second select unit 520 receives the delayed signal ('PCG5') from the first delay unit 550 and produces the refresh precharge signal 'PCGR'. The refresh precharge signal 'PCGR' is then input to the precharge signal generating unit 50. When the refresh precharge signal 'PCGR' is enabled, the precharge signal generating unit 50 produces the enabled precharge signal 'PCG' and feeds it back to the bank active signal generating unit 30 so that the bank active signal 'BA' is thereby disabled. When the bank active signal 'BA' is disabled, the bank active signal 'BA' is input to the refresh signal generating unit 10 so that the refresh signal 'REF' is disabled. The bank active signal 'BA' is input to the primary sense amplifier signal generating unit 60. The primary sense amplifier signal generating unit 60 determines whether the PMOS enable signal 'PE' and the NMOS enable signal 'NE' are enabled or disabled. That is, when the bank active signal 'BA' is enabled, the PMOS enable signal 'PE' and the NMOS enable signal 'NE' are enabled. When the bank active signal 'BA' is disabled, the PMOS enable signal 'PE' and the NMOS enable signal 'NE' are disabled. The secondary sense amplifier signal generating unit 610 receives the PMOS enable signal 'PE', the NMOS enable signal 'NE', and the auto-refresh mode signal 'REF5'. The secondary sense amplifier signal generating unit 610 outputs a low level signal through the NOR gate 611-2 of the signal combining unit 611 when the auto-refresh mode signal 'REF5' has a high level, i.e., during the auto-refresh operation mode. The first inverter INV1 of the over-driving operation signal generating unit 612 disables the over-driving operation signal 'SAE1B' by inverting the low level signal from the NOR gate 611-2 and outputting a fixed signal having a high level. That is, during the auto-refresh operation mode, the over-driving operation is not carried out. The secondary sense amplifier signal generating unit 610 outputs the disabled over-driving operation signal 'SAE1B', and outputs the first sense amplifier signal 'SAE2B' and the second sense amplifier signal 'SAENB' for sensing the internal core voltage.

The auto-refresh operation control circuit 2 will now be described in detail below during the self-refresh operation mode.

During the self-refresh operation mode, the bank active signal 'BA' is enabled in response to the refresh operation signal 'ACTR'. The mode signal generating unit 400 disables the auto-refresh mode signal 'REF5' and enables the self-refresh mode signal 'REF6'. The delay time determining unit 500 receives the bank active signal 'BA' and the mode signals 'REF5' and 'REF6' and produces the refresh precharge signal 'PCGR' via the third select unit 530, the second delay unit 560, and the fourth select unit 540. The third select unit 530 receives the enabled self-refresh mode signal 'REF6' and outputs an enable signal to the second delay unit 560, which is passed by the fourth select unit 540 to output the refresh precharge signal 'PCGR'. Since the self-refresh mode signal 'REF6' is not input to the sense amplifier signal generating unit 600, the sense amplifier signal generating unit 600 produces the enabled over-driving operation signal 'SAE1B', the first sense amplifier signal 'SAE2B', and the second sense amplifier signal 'SAENB' according to received bank active signal 'BA'. Accordingly, the over-driving operation is carried out in the self-refresh operation mode and the RAS time is not increased by the second delay unit 560, which exhibits the same operation as a conventional refresh operation control circuit.

As apparent from the above description of the present invention, the delay time determining unit discriminates between the auto-refresh operation mode and the self-refresh operation mode. In the case of the auto-refresh operation mode, current consumption is reduced by preventing the over-driving operation. Furthermore, cell data is sufficiently stored due to the increased RAS time by delaying the enable timing of the precharge signal.

While certain embodiments have been described above, it will be understood that the embodiments described are by way of example only. Accordingly, the systems and methods described herein should not be limited based on the described embodiments. Rather, the systems and methods described herein should only be limited in light of the claims that follow when taken in conjunction with the above description and accompanying drawings.

What is claimed is:

1. An auto-refresh operation control circuit of a semiconductor memory apparatus comprising:
    a bank active signal generating unit configured to receive a refresh signal and a precharge signal to generate a bank active signal;
    a mode signal generating unit configured to receive the refresh signal and generate mode signals, wherein the mode signals are enabled according to refresh operation modes;
    a delay time determining unit configured to receive the bank active signal and the mode signals, and generate a refresh precharge signal by delaying the bank active signal in response to the mode signals;
    a precharge signal generating unit configured to receive the refresh precharge signal and generate the precharge signal; and
    a sense amplifier signal generating unit configured to generate an over-driving operation signal in response to the bank active signal and the mode signals, wherein the over-driving operation signal is enabled according to the refresh operation modes.

2. The auto-refresh operation control circuit of claim 1, wherein the mode signals includes an auto-refresh mode signal and a self-refresh mode signal.

3. The auto-refresh operation control circuit of claim 2, wherein the mode signal generating unit enables the auto-refresh mode signal and disables the self-refresh mode signal at an auto-refresh operation mode, and
    wherein the mode signal generating unit disables the auto-refresh mode signal and enables the self-refresh mode signal at a self-refresh operation mode.

4. The auto-refresh operation control circuit of claim 2, wherein the delay time determining unit comprises:
    a first select unit configured to receive the bank active signal and the auto-refresh mode signal;
    a first delay unit configured to receive an output signal of the first select unit;
    a second select unit configured to receive an output signal of the first delay unit and then produce the refresh precharge signal;
    a third select unit configured to receive the bank active signal and the self-refresh mode signal;
    a second delay unit configured to receive an output signal of the third select unit; and
    a fourth select unit configured to receive an output signal of the second delay unit and then produce the refresh precharge signal.

5. The auto-refresh operation control circuit of claim 4, wherein the output signal of the first select unit is enabled when both the bank active signal and the auto-refresh mode signal are enabled.

6. The auto-refresh operation control circuit of claim 4, wherein the output signal of the third select unit is enabled when both the bank active signal and the self-refresh mode signal are enabled.

7. The auto-refresh operation control circuit of claim 4, wherein a delay operation executed by the first delay unit has a delay amount that is longer than a delay amount executed by the second delay unit.

8. The auto-refresh operation control circuit of claim 4, wherein the second select unit outputs the output signal of the first delay unit as the refresh precharge signal when the auto-refresh mode signal is enabled.

9. The auto-refresh operation control circuit of claim 4, wherein the fourth select unit outputs the output signal of the second delay unit as the refresh precharge signal when the self-refresh mode signal is enabled.

10. The auto-refresh operation control circuit of claim 2, wherein the mode signal that is input to the sense amplifier signal generating unit is the auto-refresh mode signal.

11. The auto-refresh operation control circuit of claim 2, wherein the sense amplifier signal generating unit comprises:
    a primary sense amplifier signal generating unit configured to receive the bank active signal and then produce a PMOS enable signal and an NMOS enable signal; and
    a secondary sense amplifier signal generating unit configured to produce the over-driving operation signal according to the PMOS enable signal, the NMOS enable signal, and the auto-refresh mode signal.

12. The auto-refresh operation control circuit of claim 11, wherein the secondary sense amplifier signal generating unit comprises:
    a signal combining unit configured to receive the PMOS enable signal and the auto-refresh mode signal and then produce a combination signal;
    an over-driving operation signal generating unit configured to receive the combination signal and then output the over-driving operation signal;
    a first sense amplifier signal generating unit configured to receive the PMOS enable signal and the combination signal and then produce a first sense amplifier signal; and
    a second sense amplifier signal generating unit configured to receive the NMOS enable signal and then produce a second sense amplifier signal.

13. The auto-refresh operation control circuit of claim 12, wherein the combination signal is disabled and outputted by the signal combining unit when the auto-refresh mode signal is enabled.

14. The auto-refresh operation control circuit of claim 12, wherein the signal combining unit comprises:
    a pulse generating unit configured to receive the PMOS enable signal; and a NOR gate configured to receive the auto-refresh mode signal and an output signal of the pulse generating unit.

15. The auto-refresh operation control circuit of claim 2, wherein the sense amplifier signal generating unit disables the over-driving operation signal when the auto-refresh mode signal is enabled.

16. The auto-refresh operation control circuit of claim 1, wherein the delay time determining unit has a different delay time according to the refresh operation modes.

17. The auto-refresh operation control circuit of claim 1, wherein the sense amplifier signal generating unit produces a first and a second sense amplifier signal for driving sense amplifiers.

18. The auto-refresh operation control circuit of claim 1, wherein the auto-refresh operation control circuit further comprises:
a refresh signal generating unit configured to produce the refresh signal by receiving a refresh operation signal and the bank active signal.

19. The auto-refresh operation control circuit of claim 18, wherein the refresh signal generating unit comprises:
a first pulse generating unit configured to receive the refresh operation signal;
an inverter configured to invert the bank active signal;
a second pulse generating unit configured to receive an output signal of the inverter; and
a RS flip-flop having a set terminal to receive an output signal of the first pulse generating unit and a reset terminal to receive an output signal of the second pulse generating unit.

20. The auto-refresh operation control circuit of claim 1, wherein the bank active signal generating unit is configured to receive a reset signal.

21. The auto-refresh operation control circuit of claim 1, wherein the bank active signal generating unit comprises:
an activation signal generating unit configured to receive the refresh signal, a normal active signal, a reset signal, and the precharge signal and then determine whether the active bank signal is enabled accordingly; and
a first latch unit configured to receive an output signal of the activation signal generating unit and then output the bank active signal.

* * * * *